(12) United States Patent  
Nagata

(10) Patent No.: US 8,970,012 B2
(45) Date of Patent: *Mar. 3, 2015

(54) SEMICONDUCTOR DEVICE, FABRICATION PROCESS, AND ELECTRONIC DEVICE

(71) Applicant: Sony Corporation, Tokyo (JP)

(72) Inventor: Masaya Nagata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/261,033

(22) Filed: Apr. 24, 2014

(65) Prior Publication Data

US 2014/0232002 A1    Aug. 21, 2014

Related U.S. Application Data

(63) Continuation of application No. 13/412,256, filed on Mar. 5, 2012, now Pat. No. 8,736,027.

(30) Foreign Application Priority Data

Mar. 11, 2011    (JP) .................. 2011-054389

(51) Int. Cl.
*H01L 31/0232*    (2014.01)
*H01L 23/498*    (2006.01)
*H01L 27/146*    (2006.01)
*H01L 21/768*    (2006.01)

(52) U.S. Cl.
CPC .... *H01L 23/49827* (2013.01); *H01L 27/14618* (2013.01); *H01L 27/14683* (2013.01); *H01L 21/76898* (2013.01); *H01L 23/49866* (2013.01); *H01L 2924/0002* (2013.01)
USPC ............ 257/621; 257/E23.023; 257/E21.506; 257/433; 438/107; 438/613

(58) Field of Classification Search
USPC .................. 257/433, 621, E23.023, E21.506; 438/107, 613
See application file for complete search history.

(56) References Cited

U.S. PATENT DOCUMENTS

2007/0265792 A1    11/2007    Gui et al.
2009/0284631 A1    11/2009    Matsuo et al.
(Continued)

FOREIGN PATENT DOCUMENTS

JP    2004-056031    2/2004
(Continued)

OTHER PUBLICATIONS

Japanese Office Action dated Dec. 11, 2014 in application No. 2011-054389.

*Primary Examiner* — Cheung Lee
*Assistant Examiner* — Stephen Bradley
(74) *Attorney, Agent, or Firm* — Oblon, Spivak, McClelland, Maier & Neustadt, L.L.P.

(57) ABSTRACT

A semiconductor device is provided, including a semiconductor substrate that includes a semiconductor; an electrode layer formed above a first surface side inside the semiconductor substrate; a conductor layer formed above the electrode layer and above the first surface of the semiconductor substrate; a hole formed through the semiconductor substrate from a second surface of the semiconductor substrate to the conductor layer; and a wiring layer that is electrically connected to the electrode layer via the conductor layer at an end portion of the vertical hole, and that extends to the second surface of the semiconductor substrate, the wiring layer being physically separated from the electrode layer by an insulating layer disposed therebetween.

16 Claims, 7 Drawing Sheets

(56) References Cited

U.S. PATENT DOCUMENTS

2010/0321544 A1 12/2010 Matsuo et al.
2011/0024858 A1 2/2011 Yoshihara et al.

FOREIGN PATENT DOCUMENTS

| JP | 2007-305995 | 11/2007 |
| JP | 2009-158862 | 7/2009 |
| JP | 2010-109380 | 5/2010 |
| JP | 2011-035038 | 2/2011 |

| MATERIAL | MELTING POINT(°C) |
|---|---:|
| Si | 1410 |
| Ag | 961 |
| Au | 1063 |
| Cr | 1890 |
| Cu | 1083 |
| Ir | 2410 |
| Mo | 2610 |
| Nb | 2468 |
| Ni | 1453 |
| Pd | 1552 |
| Pt | 1769 |
| Ru | 2250 |
| Ta | 2998 |
| V | 1890 |
| W | 3410 |
| Zr | 1852 |

SEMICONDUCTOR DEVICE, FABRICATION PROCESS, AND ELECTRONIC DEVICE

CROSS-REFERENCE TO RELATED APPLICATIONS

This application is a Continuation of U.S. application Ser. No. 13/412,256, filed on Mar. 5, 2012, and claims priority to Japanese Patent Application No. 2011-054389, filed on Mar. 11, 2011, the entire contents of both of which are incorporated herein by reference.

FIELD

The present disclosure relates to semiconductor devices, fabrication processes, and electronic devices, particularly to semiconductor devices, fabrication processes, and electronic devices with which the manufacturing costs can be reduced.

BACKGROUND

Solid-state imaging devices as represented by CMOS (Complementary Metal Oxide Semiconductor) image sensors have come to use WL-CSP (Wafer Level Chip Size Package). WL-CSP involves formation of terminals and wiring prior to cutting out chips from a semiconductor substrate.

WL-CSP fabrication steps include a process by which, for example, a fine vertical hole (VIA) is formed that opens to the metal pad inside a semiconductor substrate from the back of the semiconductor substrate. The formation of the vertical hole is a process that greatly influences the manufacturing cost of the semiconductor element.

The vertical hole has been formed in a silicon wafer using DRIE (Deep Reactive Ion Etching) as a preceding process. However, DRIE involves high device cost. Further, DRIE requires a photolithography step in which a photosensitive substance is exposed in patterns after being applied to a silicon wafer surface.

As a countermeasure, there has been proposed a process of forming a vertical hole in a silicon wafer using a substrate forming technique that makes use of a laser drill. The process using a laser drill forms a vertical hole in a substrate by irradiation of a laser beam, and does not require a photolithography step. Further, because a laser drill device is less expensive, the laser drill process is much more advantageous than the DRIE process in terms of manufacturing cost.

However, it is very difficult with a laser drill to, for example, control the process with such an accuracy that the drilling stops upon the vertical hole reaching the metal pad inside the semiconductor substrate.

In this connection, JP-A-2007-305995 discloses a semiconductor device fabrication process by which a metal bump is disposed on the metal pad inside a semiconductor substrate, and in which a vertical hole is formed with a laser drill that reaches the metal bump. In this process, the metal bump is used as a stopper for the laser drill forming the vertical hole. For example, a 15 μm-thick plated nickel is used as the metal bump.

SUMMARY

However, using a metal bump as a stopper for the laser drill as disclosed in the foregoing publication requires a low laser output to avoid penetration through the metal bump. Accordingly, the vertical hole processing takes a long time. It also takes a long time to form the 15 μm-thick plated nickel used as the metal bump. The long processing time for the formation of the vertical hole in a semiconductor substrate increases the manufacturing cost.

It is envisaged that increasing the thickness of the metal bump would avoid penetration of the metal bump even at a high laser drill output. However, formation of a thick metal bump adds extra time.

Accordingly, there is a need to reduce manufacturing cost by way of reducing the vertical hole processing time.

Thus, it is desirable to provide ways to reduce manufacturing cost.

An embodiment of the present disclosure is directed to a semiconductor device that includes: a semiconductor substrate that includes a semiconductor; an electrode layer formed on a first surface side inside the semiconductor substrate; a frame layer laminated on the first surface of the semiconductor substrate; a conductor layer formed in an aperture portion formed by processing the semiconductor substrate and the frame layer in such a manner as to expose the electrode layer on the first surface of the semiconductor substrate; a vertical hole formed through the semiconductor substrate from a second surface of the semiconductor substrate to the conductor layer; and a wiring layer that is electrically connected to the electrode layer via the conductor layer at an end portion of the vertical hole, and that extends to the second surface of the semiconductor substrate.

Another embodiment of the present disclosure is directed to a process for fabricating a semiconductor device. The process includes: forming an electrode layer on a first surface side inside a semiconductor substrate that includes a semiconductor; laminating a frame layer on the first surface of the semiconductor substrate; forming a conductor layer in an aperture portion formed by processing the semiconductor substrate and the frame layer in such a manner as to expose the electrode layer on the first surface of the semiconductor substrate; forming a vertical hole through the semiconductor substrate from a second surface of the semiconductor substrate to the conductor layer; and forming a wiring layer that is electrically connected to the electrode layer via the conductor layer at an end portion of the vertical hole, and that extends to the second surface of the semiconductor substrate.

Still another embodiment of the present disclosure is directed to an electronic device including: a semiconductor device that includes a semiconductor substrate that includes a semiconductor, an electrode layer formed on a first surface side inside the semiconductor substrate, a frame layer laminated on the first surface of the semiconductor substrate, a conductor layer formed in an aperture portion formed by processing the semiconductor substrate and the frame layer in such a manner as to expose the electrode layer on the first surface of the semiconductor substrate, a vertical hole formed through the semiconductor substrate from a second surface of the semiconductor substrate to the conductor layer, and a wiring layer that is electrically connected to the electrode layer via the conductor layer at an end portion of the vertical hole, and that extends to the second surface of the semiconductor substrate.

According to the embodiments of the present disclosure, the electrode layer is formed on a first surface side inside the semiconductor substrate, the frame layer is laminated on the first surface of the semiconductor substrate, and the conductor layer is formed in the aperture portion formed by processing the semiconductor substrate and the frame layer in such a manner as to expose the electrode layer on the first surface of the semiconductor substrate. The vertical hole is formed through the semiconductor substrate from a second surface of the semiconductor substrate to the conductor layer, and the wiring layer is formed that is electrically connected to the electrode layer via the conductor layer at an end portion of the vertical hole, and that extends to the second surface of the semiconductor substrate.

In accordance with the embodiments of the present disclosure, the manufacturing cost can be reduced.

DETAILED DESCRIPTION

An embodiment of the present disclosure is described in detail below with reference to the accompanying drawings.

Figure 1:
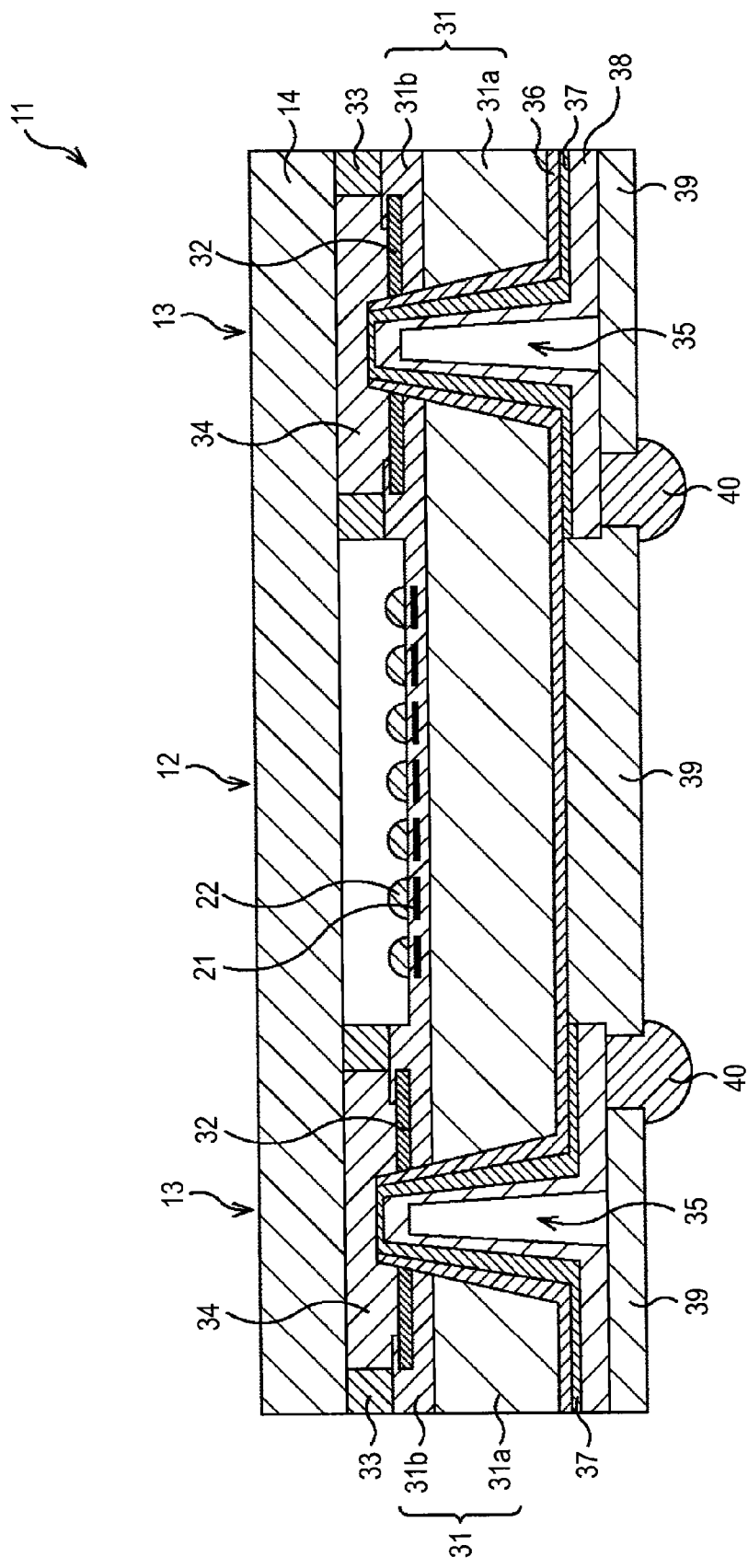
FIG. 1 is a cross sectional view illustrating an exemplary structure of a solid-state imaging device according to an embodiment of the present disclosure.

FIG. 1 is a cross sectional view illustrating an exemplary structure of a solid-state imaging device according to an embodiment of the present disclosure.

Referring to FIG. 1, a solid-state imaging device 11 is configured to include a sensor unit 12 that detects light from a subject, and a vertical hole wiring unit 13 by which the output signal from the sensor unit 12 is extracted from the bottom surface side. The sensor unit 12 and the vertical hole wiring unit 13 are covered with a glass substrate 14 on the top surface side.

The sensor unit 12 includes a plurality of photodiodes 21 that outputs charge signals according to the received light, and on-chip microlenses 22 that condense light on the photodiodes 21. Though not illustrated, the sensor unit 12 is also provided with other components, including a color filter, a floating diffusion, and various transistors.

The vertical hole wiring unit 13 is configured from a metal pad 32, a glass sealant 33, and a stopper layer 34 laminated on the top surface of the silicon wafer 31 (the upper side in FIG. 1). The glass substrate 14 is disposed on the top surfaces of the glass sealant 33 and the stopper layer 34. Further, the vertical hole wiring unit 13 is configured from an insulating film 36, a metal seed layer 37, and a plating layer 38 formed on the inner and bottom surfaces of a vertical hole 35 formed through the silicon wafer 31 (on the lower side in FIG. 1). A solder mask 39 is formed on the bottom surfaces of the insulating film 36 and the plating layer 38, and a solder ball 40 is disposed through the solder mask 39 and in contact with the plating layer 38.

The silicon wafer 31 is a thin semiconductor substrate. An oxide film 31b is formed on the top surface of a silicon layer 31a.

The metal pad 32 is a metallic layer formed inside the oxide film 31b of the silicon wafer 31, specifically on the top surface side inside the silicon wafer 31, and serves as an electrode that outputs signals from the sensor unit 12. Metals, for example, such as aluminum, copper, tungsten, nickel, and tantalum are used for the metal pad 32.

The glass sealant 33 is a sealant bonding the glass substrate 14 to the silicon wafer 31. An aperture portion 42 (see FIG. 2) is formed in the glass sealant 33, and the glass sealant 33 serves as a layer providing a frame for the stopper layer 34.

The stopper layer 34 is a conductor layer filling the aperture portion formed in the oxide film 31b and the glass sealant 33 in such a manner as to expose the metal pad 32 on the top surface of the silicon wafer 31. The stopper layer 34 is formed in substantially the same thickness as that of the glass sealant 33, for example, in about 50 μm, preferably 10 to 100 μm. The stopper layer 34 may be formed using, for example, silver or copper, as described below with reference to FIG. 6.

The vertical hole 35 is a fine hole formed to wire the metal pad 32 formed on the top surface side of the silicon wafer 31 to the bottom surface of the silicon wafer 31, and is substantially orthogonal to the bottom surface of the silicon wafer 31. The insulating film 36 insulates the bottom surface side of the silicon wafer 31. The metal seed layer 37 is a wire through which the signals from the sensor unit 12 are guided to the bottom surface side of the silicon wafer 31. The metal seed layer 37 is electrically connected to the metal pad 32 via the stopper layer 34 at the end portion of the vertical hole 35, and extends to the bottom surface of the silicon wafer 31.

The plating layer 38 is a layer used as, for example, a mask when forming the metal seed layer 37 by etching. The solder mask 39 is a mask that prevents a solder from adhering to unwanted portions when externally connecting a wire to the solder ball 40. The solder ball 40 is a terminal connected to the wire through which the signals from the sensor unit 12 are output to outside.

The following describes the fabrication steps of the vertical hole wiring unit 13 with reference to FIGS. 2 to 5.

Figure 2:
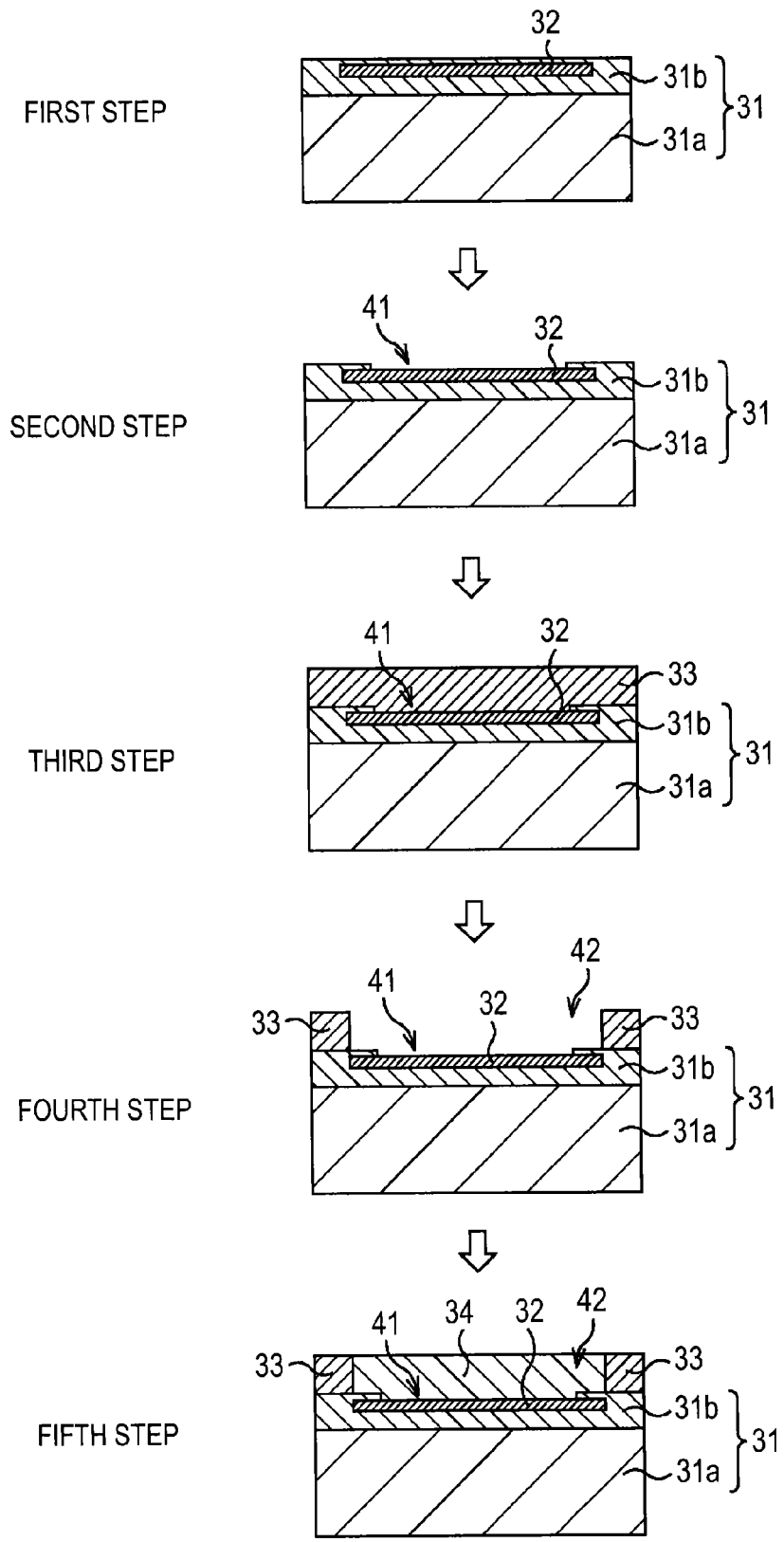
FIG. 2 is a diagram explaining the fabrication steps of a vertical hole wiring unit.

First, in the first step represented in FIG. 2, the metal pad 32 is formed in the oxide film 31b of the silicon wafer 31. The metal pad 32 represents, for example, an end of the signal line (BEOL: Back End Of the Line) connected to the select transistor (not illustrated) of the sensor unit 12.

In the second step, an aperture portion 41 is formed in a portion of the oxide film 31b corresponding to the metal pad 32 on the top surface side of the silicon wafer 31, exposing the metal pad 32. The aperture portion 41 is formed to have a smaller area than the metal pad 32 as viewed from the top surface, and the oxide film 31b overlies on the edges of the metal pad 32. Specifically, the metal pad 32 is formed a size larger taking into consideration the process margin for forming the aperture portion 41.

In the third step, the glass sealant 33 is formed on the top surfaces of the silicon wafer 31 and the metal pad 32. The glass sealant 33 is also formed on the top surface of the sensor unit 12 (FIG. 1).

In the fourth step, the aperture 42 is formed in the glass sealant 33, exposing the metal pad 32. The aperture portion 42 is formed in the glass sealant 33 in a size larger than the area of the aperture portion 41 formed in the oxide film 31b, as viewed from the top surface, in order to ensure that the metal pad 32 is exposed on the top surface side. The oxide film 31b overlying on the edges of the metal pad 32 is also exposed on the top surface side.

Figure 4:
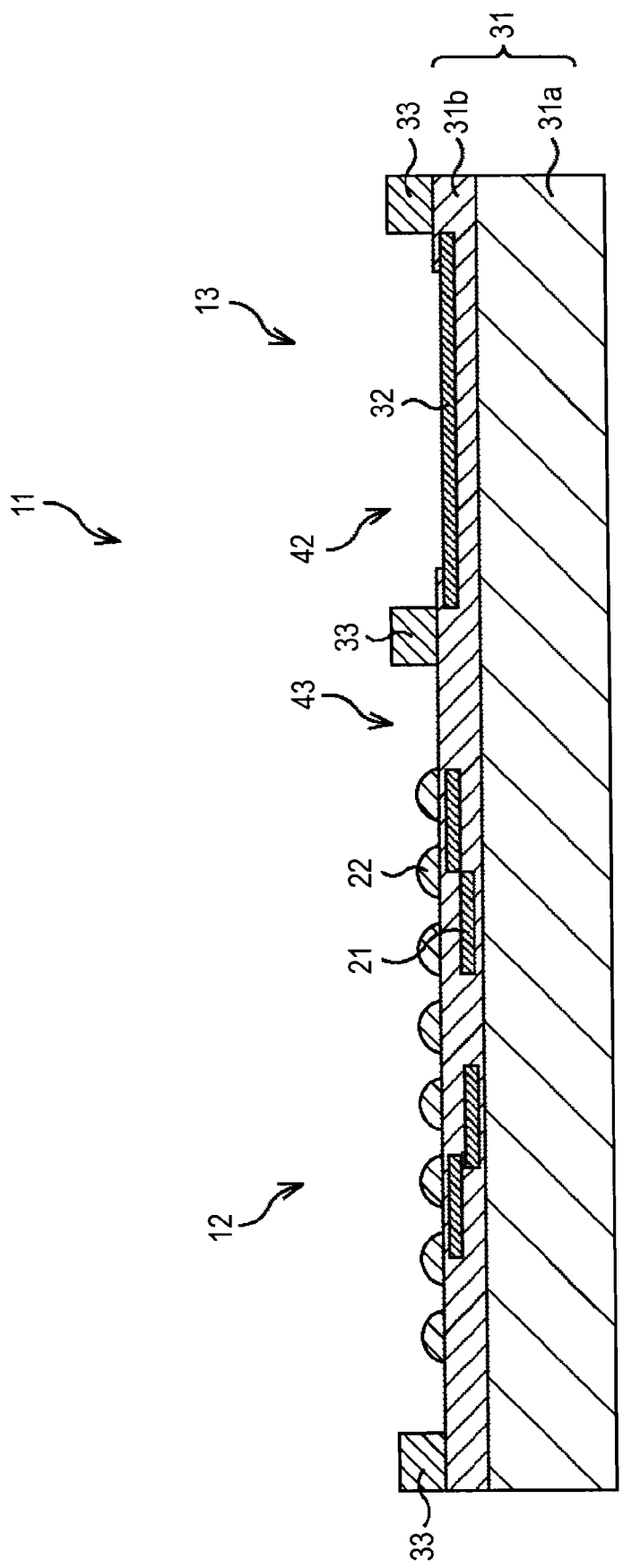
FIG. 4 is a diagram representing the state in which an aperture portion is formed in a glass sealant and a sensor unit.

Note that, in the fourth step, as illustrated in FIG. 4, an aperture portion 43 is formed in the glass sealant 33 formed on the top surface of the sensor unit 12, simultaneously with the aperture portion 42 formed in the glass sealant 33. FIG. 4 illustrates the aperture portion 42 formed in the glass sealant 33, and the aperture portion 43 formed for the sensor unit 12.

In the fifth step, the stopper layer 34 is formed in the aperture portion 41 formed in the oxide film 31b, and in the aperture portion 42 formed in the glass sealant 33. The stopper layer 34 may be formed by using methods such as screen printing, spray coating, and stud bumping.

Figure 5A:
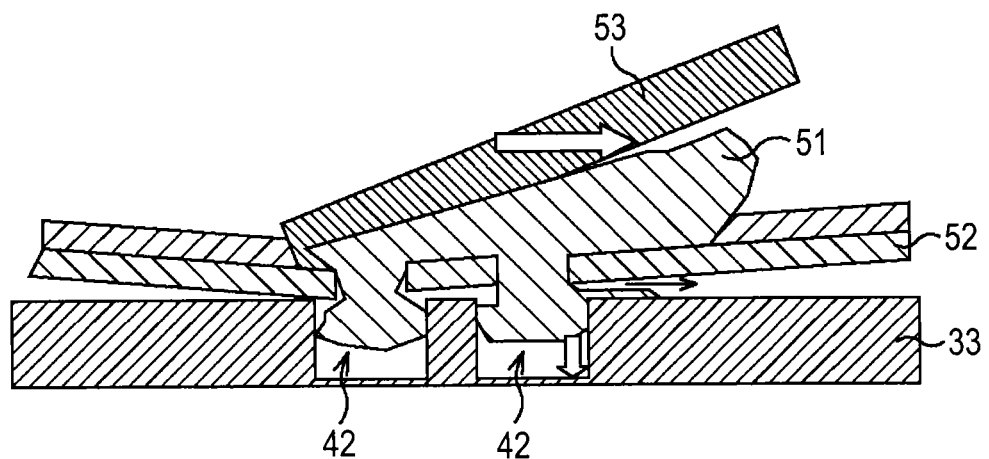
FIGS. 5A and 5B are diagrams explaining screen printing and spray coating.

FIG. 5A schematically represents screen printing. In screen printing, a conductive paste 51 as the material of the stopper layer 34 is placed on the top surface of a screen 52 having a hole corresponding to the aperture portion 42 formed in the glass sealant 33, and spread over against the screen 52 using a squeegee 53. As a result, the paste 51 that has passed through the screen 52 through the hole fills the aperture portion 42 and forms the stopper layer 34.

Figure 5B:
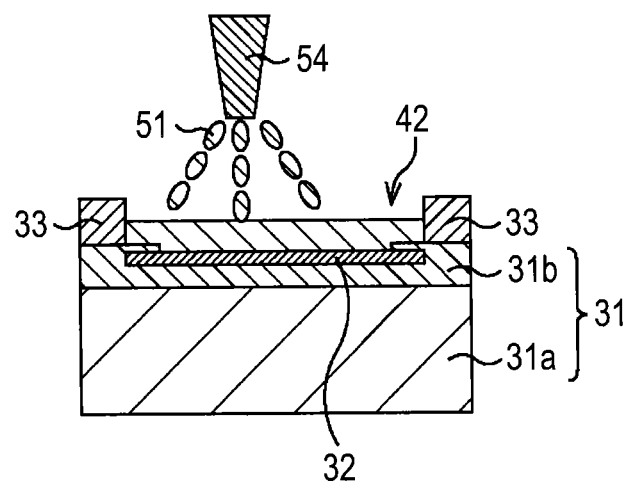

FIG. 5B schematically represents spray coating. In spray coating, the conductive paste 51 as the material of the stopper layer 34 is ejected in trace portions through a nozzle 54. The paste 51 fills the aperture portion 42 formed in the glass sealant 33, and forms the stopper layer 34.

The stopper layer 34 is formed in this manner, and has about the same thickness (for example, about 50 µm) as the glass sealant 33.

Figure 3:
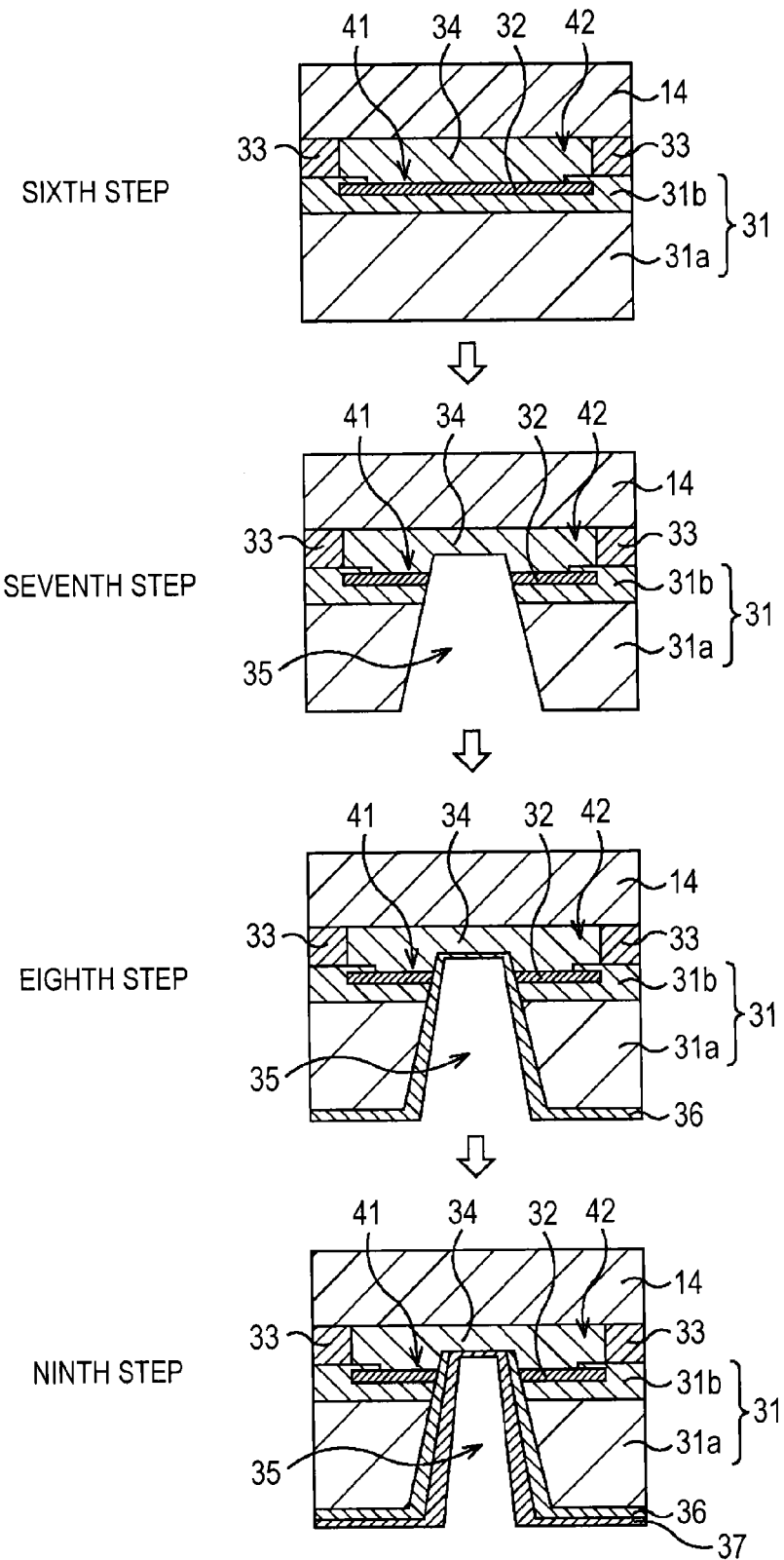
FIG. 3 is diagram explaining the fabrication steps of the vertical hole wiring unit.

In the next sixth step illustrated in FIG. 3, the glass substrate 14 is bonded to the top surface of the silicon wafer 31 via the glass sealant 33. Further, in this step, the thickness of the silicon wafer 31 is reduced by grinding the bottom surface side of the silicon wafer 31 (BGR: Back Grind).

In the seventh step, the vertical hole 35 is formed through the metal pad 32 to the stopper layer 34, using a laser drill. Here, the laser drill stops at the stopper layer 34 thicker than, for example, the metal bump disclosed in JP-A-2007-305995, and does not proceed farther even at a high output. Specifically, the vertical hole 35 is formed by a high-output laser drill without penetrating through the stopper layer 34.

In the eighth step, the insulating film 36 is formed on the bottom surfaces of the vertical hole 35 and the silicon wafer 31.

In the ninth step, the insulating film 36 at the end surface of the vertical hole 35 is removed to expose the stopper layer 34 to the vertical hole 35. The metal seed layer 37 is then laminated on the stopper layer 34 and the insulating film 36. As a result, the stopper layer 34 and the metal seed layer 37 are electrically connected to each other. This is followed by the formation of the plating layer 38, the solder mask 39, and the solder ball 40 as shown in FIG. 1.

This completes the vertical hole wiring unit 13. Because the stopper layer 34 is formed by charging the paste 51 (FIGS. 5A and 5B) into the aperture portion 42 formed in the glass sealant 33, the stopper layer 34 can have a thickness as thick as about 50 µm. Further, because screen printing or spray coating is used, the stopper layer 34 can be formed more quickly, for example, about ½ to ¹⁄₁₀ of the processing time required in methods such as sputtering.

Increasing the thickness of the stopper layer 34 as in the foregoing fabrication steps of the fabrication process thus allows for use of a higher output laser drill than in the fabrication process disclosed in JP-A-2007-305995. The high-output laser drill makes it possible to form the vertical hole 35 in a shorter time period, and can thus shorten the fabrication time of the vertical hole wiring unit 13 from that of the related art. This, in turn, shortens the fabrication time of the solid-state imaging device 11 as a whole, and reduces the manufacturing cost of the solid-state imaging device 11.

It might be possible to stop the laser drill at the metal bump by, for example, increasing the thickness of the metal bump disclosed in JP-A-2007-305995. However, increasing the thickness of the metal bump not only takes a long time to form the metal bump, but may cause the metal bump to contact the adjacent metal bump. In contrast, the stopper layer 34 is free from such a contact in the fabrication process of the vertical hole wiring unit 13 of the solid-state imaging device 11, because the stopper layer 34 is formed so as to fill the aperture portion formed in the glass sealant 33.

Further, because the device cost for the laser drilling is less expensive than that of DRIE, the manufacturing cost of the solid-state imaging device 11 can also be lowered in this regard.

Further, the stopper layer 34 formed as thick as about 50 µm can reliably stop the laser drill processing of the vertical hole 35, and the laser drill process can be easily controlled. Further, the thickness of the stopper layer 34 enables easy control of the laser drill process, and a desirable contact can be obtained between the stopper layer 34 and the metal seed layer 37 even when there is some variation in the depth of the vertical hole 35. It can therefore be said that the solid-state imaging device 11 has a robust design for the depth variation of the vertical hole 35.

Figures 6, 7:
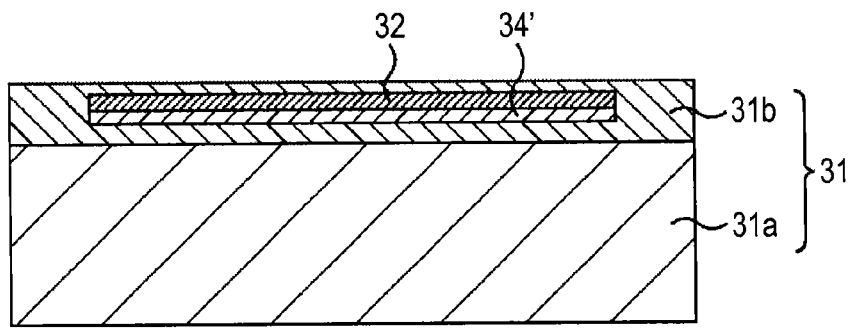
FIG. 6 is a diagram listing materials usable as a stopper layer.
FIG. 7 is a diagram illustrating a silicon wafer that includes a stopper layer formed on the bottom surface of a metal pad.

FIG. 6 is a list of materials usable as the stopper layer 34.

As described above, because the vertical hole 35 is formed in the silicon wafer 31 by laser drilling, the stopper layer 34 is preferably formed using a material having a melting point higher than the melting point (1,410° C.) of silicon (Si), in order to stop the progression of the laser drill at the stopper layer 34. Further, because the stopper layer 34 can be made as thick as about 50 µm in the vertical hole wiring unit 13 even with a material having a lower melting point than silicon, the laser drill can stop at the stopper layer 34 and does not penetrate through this thick layer.

Examples of stopper layer 34 materials having lower melting point than silicon include silver (Ag: melting point 961° C.), gold (Au: melting point 1,063° C.), and copper (Cu: melting point 1,083° C.).

Examples of stopper layer 34 materials having higher melting point than silicon include chromium (Cr: melting point 1,890° C.), iridium (Ir: melting point 2,410° C.), molybdenum (Mo: melting point 2,610° C.), niobium (Nb: melting point 2,468° C.), nickel (Ni: melting point 1,453° C.), palladium (Pd: melting point 1,552° C.), platinum (Pt: melting point 1,769° C.), ruthenium (Ru: melting point 2,250° C.), tantalum (Ta: melting point 2,998° C.), vanadium (V: melting point 1,890° C.), tungsten (W: melting point 3,410° C.), and zirconium (Zr: melting point 1,852° C.).

For example, silver and copper, readily available in the form of a paste, are preferably used as the stopper layer 34. Aside from the materials exemplified above, compounds such as titanium nitride (TiN) and tantalum nitride (TaN) also may be used as the stopper layer 34. Titanium nitride and tantalum nitride have melting points of 2,930° C. and 3,090° C., respectively, much higher than the melting point of silicon, and thus the progression of the laser drill can be more desirably stopped at the stopper layer 34 formed in the foregoing thickness range using titanium nitride or tantalum nitride.

Note that the stopper layer 34, formed on the top surface of the metal pad 32 in the foregoing exemplary structure of the vertical hole wiring unit 13, may be formed on the bottom surface of the metal pad 32.

FIG. 7 represents a silicon wafer 31 that includes a stopper layer 34' formed on the bottom surface of the metal pad 32. For example, the stopper layer 34' may be formed on the bottom surface of the metal pad 32 by forming the stopper layer 34' before the metal pad 32 in the first step described in FIG. 2.

Figure 8:
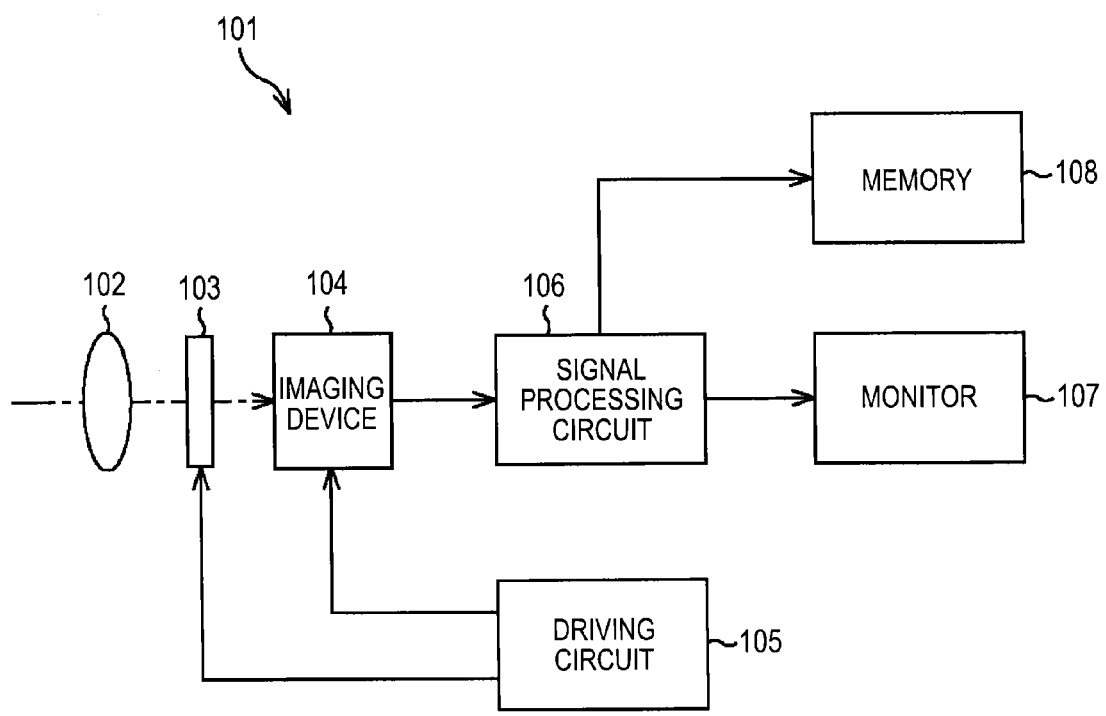
FIG. 8 is a block diagram representing an exemplary structure of an imager installed in an electronic device.

FIG. 8 is a block diagram illustrating an exemplary structure of an imager installed in an electronic device.

As illustrated in FIG. 8, an imager 101 is configured to include an optical system 102, a shutter unit 103, an imaging device 104, a driving circuit 105, a signal processing circuit 106, a monitor 107, and a memory 108, and is capable of capturing both a still image and a moving image.

The optical system 102 is configured from one or more lenses, and guides subject's image light (incident light) onto the imaging device 104, forming an image on the light receiving surface (sensor unit) of the imaging device 104.

The shutter unit 103 is disposed between the optical system 102 and the imaging device 104, and controls the exposure time of the imaging device 104 under the control of the driving circuit 105.

A solid-state imaging device 11 of the foregoing exemplary structure is used as the imaging device 104. The imaging device 104 accumulates signal charges for a certain time period according to the image formed on the light receiving surface through the optical system 102 and the shutter unit 103. The signal charges accumulated in the imaging device 104 are then transferred according to the drive signal (timing signal) supplied from the driving circuit 105.

The driving circuit 105 outputs drive signals that control the transfer operation of the imaging device 104 and the shutter operation of the shutter unit 103, so as to drive the imaging device 104 and the shutter unit 103.

The signal processing circuit 106 processes the output signal charges from the imaging device 104. The image (image data) obtained after the signal processing in the signal processing circuit 106 is supplied to and displayed on the monitor 107, and/or supplied to and stored (recorded) in the memory 108.

The imager 101 configured as above includes the imaging device 104 realized by the solid-state imaging device 11 that can be manufactured at low cost as above. The imager 101 can thus be manufactured at low cost.

Aside from laser drilling, techniques such as DRIE and dry etching may be used for the processing of the vertical hole 35.

The solid-state imaging device 11 may be configured as a back-side illumination CMOS solid-state imaging device, a front-side illumination CMOS solid-state imaging device, or a CCD (Charge Coupled Device) solid-state imaging device. The present disclosure is also applicable to semiconductor devices (semiconductor elements) other than the solid-state imaging device, including, for example, a logic chip configured to include a logic circuit integrated on an IC (Integrated Circuit) chip.

It should be noted that the present disclosure is not limited to the foregoing embodiment, and various modifications are possible within the substance of the present disclosure.

What is claimed is:

1. A semiconductor device, comprising:
   a semiconductor substrate that includes a semiconductor;
   an electrode layer formed above a first surface side inside the semiconductor substrate;
   a conductor layer formed above the electrode layer and above the first surface of the semiconductor substrate;
   a hole formed through the semiconductor substrate from a second surface of the semiconductor substrate to the conductor layer; and
   a wiring layer that is electrically connected to the electrode layer via the conductor layer at an end portion of the hole, and that extends to the second surface of the semiconductor substrate, the wiring layer being physically separated from the electrode layer by an insulating layer disposed therebetween.

2. The semiconductor device according to claim 1, further comprising a frame layer laminated on the first surface of the semiconductor substrate, wherein the frame layer is a sealant configured to bond a glass substrate to the first surface of the semiconductor substrate.

3. The semiconductor device according to claim 2, wherein the conductor layer fills an aperture portion in the sealant.

4. The semiconductor device according to claim 3, wherein the conductor layer includes silver or copper.

5. The semiconductor device according to claim 3, wherein the conductor layer is substantially the same thickness as the sealant.

6. The semiconductor device according to claim 3, wherein the conductor layer has a thickness of about 50 μm.

7. The semiconductor device according to claim 1, wherein the electrical connection between the electrode layer and the conductor layer is only at the end portion of the hole, the end portion being located within the conductor layer.

8. The semiconductor device according to claim 7, wherein the end portion located within the conductor layer is disposed above an uppermost surface of the electrode layer.

9. The semiconductor device according to claim 1, wherein the hole extends into a portion of the conductor layer.

10. The semiconductor device according to claim 9, wherein the hole perforates the electrode layer.

11. The semiconductor device according to claim 9, wherein the insulating layer is disposed around the wiring layer in the hole and extends into the portion of the conductor layer.

12. The semiconductor device according to claim 11, wherein the insulating layer extends above an uppermost surface of the electrode layer.

13. The semiconductor device according to claim 1, wherein the conductor layer is a material having a melting point greater than 1,410° C.

14. The semiconductor device according to claim 1, wherein the conductor layer is a material having a melting point less than or equal to about 1,410° C.

15. The semiconductor device according to claim 1, wherein the conductor layer is in the form of a paste material.

16. The semiconductor device according to claim 1, wherein the electrode layer includes aluminum, copper, tungsten, nickel, or tantalum, or a combination thereof.

* * * * *